(12) United States Patent
Kimura et al.

(10) Patent No.: US 6,248,254 B1
(45) Date of Patent: Jun. 19, 2001

(54) PIEZOELECTRIC CERAMIC COMPOSITION AND PIEZOELECTRIC CERAMIC DEVICE USING THE SAME

(75) Inventors: Masahiko Kimura, Kusatsu; Akira Ando, Omihachiman; Takuya Sawada, Moriyama; Koichi Hayashi, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/500,011

(22) Filed: Feb. 8, 2000

(30) Foreign Application Priority Data

| Feb. 8, 1999 | (JP) | 11-030322 |
| May 19, 1999 | (JP) | 11-138163 |
| Oct. 13, 1999 | (JP) | 11-291254 |
| Jan. 17, 2000 | (JP) | 2000-007998 |

(51) Int. Cl.[7] .............. H01B 3/12; H01G 4/12; H01L 41/00; H03H 9/00
(52) U.S. Cl. .................. 252/62.9 R; 501/136
(58) Field of Search ............... 252/62.9 R; 501/136

(56) References Cited

U.S. PATENT DOCUMENTS 4,900,702  2/1990  Tsuboi et al. .............. 501/134

OTHER PUBLICATIONS

Derwent abstract 1989–301168 for DD 267,877, pub. May 17, 1989.*
Derwent abstract 1989–240006 for SU 1,458,356 A, pub. Feb. 15, 1989.*
Derwent abstract 1981–67331D for SU 789,458 B, pub. Dec. 23, 1980.*

* cited by examiner

*Primary Examiner*—C. Melissa Koslow
(74) *Attorney, Agent, or Firm*—Ostrolenk, Faber, Gerb & Soffen, LLP

(57) ABSTRACT

A piezoelectric ceramic composition is composed of a main component represented by the general formula $(Ca_{1-x}M1_x)Bi_4Ti_4O_{15}$ wherein M1 is one of divalent metals other than Ca and trivalent metals other than Bi, and $0<x\leq0.45$, and manganese as an auxiliary component in an amount of more than 0 to not more than about 1.5 percent by weight as $MnCO_3$. Examples of the divalent metals and trivalent metals include Sr, Ba, Mg, La, Ce, Pr, Nd, Sm, Gd, Dy, Er, Yb, Sc and Y. The piezoelectric ceramic composition has an electromechanical coupling coefficient kt of at least 10%, which a practical level. The piezoelectric ceramic composition may be used in piezoelectric ceramic filters, piezoelectric ceramic oscillators and piezoelectric ceramic vibrators.

20 Claims, 1 Drawing Sheet

PIEZOELECTRIC CERAMIC COMPOSITION AND PIEZOELECTRIC CERAMIC DEVICE USING THE SAME

BACKGROUND OF THE INVENTION

1. Field of the Invention

The present invention relates to piezoelectric ceramic compositions and piezoelectric ceramic devices using the same. In particular, the present invention relates to piezoelectric ceramic compositions which are useful as materials for piezoelectric ceramic filters, piezoelectric ceramic oscillators and piezoelectric ceramic vibrators, and relates to piezoelectric ceramic devices using the same.

2. Description of the Related Art

Piezoelectric ceramic compositions comprising lead titanate zirconate ($Pb(Ti_xZr_{1-x})O_3$) or lead titanate ($PbTiO_3$) as main components are extensively used in piezoelectric ceramic filters, piezoelectric ceramic oscillators and piezoelectric ceramic vibrators. In production of the piezoelectric ceramic compositions comprising lead titanate zirconate or lead titanate as the main components, lead oxide is generally used. Since lead oxide, however, is lost by vaporization during the production steps, the composition of the product is not uniform.

On the other hand, piezoelectric ceramic compositions comprising bismuth layered compounds such as $(Ca_{1-x}M_x)Bi_4Ti_4O_{15}$ as main components do not contain lead oxide and do not have the above problem. The bismuth-based piezoelectric ceramic compositions, however, have small electromechanical coupling coefficients kt and are not used in practice.

SUMMARY OF THE INVENTION

Accordingly, it is an object of the present invention to provide a piezoelectric ceramic composition which exhibits a high electromechanical coupling coefficient kt of at least 10%. The piezoelectric ceramic composition having such a high electromechanical coupling coefficient kt is useful as materials for piezoelectric ceramic filters, piezoelectric ceramic oscillators and piezoelectric ceramic vibrators.

It is another object of the present invention to provide a piezoelectric ceramic device using the piezoelectric ceramic composition.

According to a first aspect of the present invention, a piezoelectric ceramic composition comprising: a main component represented by the general formula $CaBi_4Ti_4O_{15}$; and manganese as an auxiliary component in an amount of more than 0 to not more than about 1.5 percent by weight calculated as $MnCO_3$.

The piezoelectric ceramic composition may further comprise a divalent metal other than Ca in an amount of more than 0 to 0.075 mole with respect to 1 mole of Bi in the main component. In such a case, the divalent metal other than Ca is at least one element selected from the group consisting of Mg, Sr and Ba.

Alternatively, the piezoelectric ceramic composition may further comprise a trivalent metal other than Bi in an amount of more than 0 to about 0.075 mole with respect to 1 mole of Bi in the main component. In such a case, the trivalent metal other than Bi is at least one element selected from the group consisting of La, Ce, Pr, Nd, Sm, Gd, Dy, Er, Yb, Sc and Y.

According to second aspect of the present invention, a piezoelectric ceramic composition comprises: a main component represented by the general formula $(Ca_{1-x}M1_x)Bi_4Ti_4O_{15}$ wherein M1 is one of divalent metals other than Ca and trivalent metals other than Bi, and $0<x\leq0.3$; and manganese as an auxiliary component in an amount of more than 0 to not more than about 1.5 percent by weight as $MnCO_3$. The M1 in the general formula may be at least one element selected from the group consisting of Sr, Ba, Mg, La, Ce, Pr, Nd, Sm, Gd, Dy, Er, Yb, Sc and Y.

According to a third aspect of the present invention, a piezoelectric ceramic composition comprises a main component represented by the general formula $(Ca_{1-x}M2_{2x/3})Bi_4Ti_4O_{15}$ wherein M2 is a trivalent metal other than Bi, and $0<x\leq0.45$; and manganese as an auxiliary component in an amount of more than 0 to not more than about 1.5 percent by weight as $MnCO_3$. The M2 in the general formula may be at least one element selected from the group consisting of La, Ce, Pr, Nd, Sm, Gd, Dy, Er, Yb, Sc and Y.

According to a fourth aspect of the present invention, a piezoelectric ceramic device comprises a piezoelectric ceramic comprising the piezoelectric ceramic composition according to one of the first to third aspects, and electrodes.

The above objects, other objects, features, and advantages of the present invention will be further apparent from the following preferred embodiments.

DESCRIPTION OF THE PREFERRED EMBODIMENTS

The piezoelectric ceramic composition in accordance with the present invention is composed of a main component represented by the formula $CaBi_4Ti_4O_{15}$, e.g., the formula $(Ca_{1-x}M1_x)Bi_4Ti_4O_5$ wherein M1 is one of divalent metals other than Ca and trivalent metals other than Bi and $0<x\leq0.3$, or the formula $(Ca_{1-x}M2_{2x/3})Bi_4Ti_4O_{15}$ wherein M2 is a trivalent metal other than Bi and $0<x\leq0.45$.

In the piezoelectric ceramic composition comprising a main component represented by the general formula $(Ca_{1-x}M1_x)Bi_4Ti_4O_5$, the subscript x indicating the M1 content lies in a range of $0<x\leq0.3$. At an M1 content outside this range, the effects of the addition are not noticeable.

In the piezoelectric ceramic composition comprising a main component represented by the general formula $(Ca_{1-x}M2_{2x/3})Bi_4Ti_4O_{15}$, the subscript x indicating the M2 content lies in a range of $0<x\leq0.45$. At an M2 content outside this range, the effects of the addition are not noticeable.

The piezoelectric ceramic composition in accordance with the present invention preferably contains manganese as an auxiliary component in an amount of more than 0 to about 1.5 percent by weight as $MnCO_3$. When the manganese content exceeds about 1.5 percent by weight as $MnCO_3$, the piezoelectric ceramic composition is not polarized. When the manganese is not added, a practical level of electromechanical coupling coefficient kt is not obtained.

The piezoelectric ceramic composition of the present invention may contain a divalent metal other than Ca in an amount of more than 0 to about 0.075 mole with respect to 1 mole of Bi in the main component. When the divalent metal content exceeds the upper limit, the electromechanical coupling coefficient kt does not reach a practical level.

Alternately, the piezoelectric ceramic composition of the present invention may contain a trivalent metal other than Bi in an amount of more than 0 to about 0.075 mole with respect to 1 mole of Bi in the main component. When the trivalent metal content exceeds the upper limit, the electromechanical coupling coefficient kt does not reach a practical level.

The advantages in the present invention are particularly noticeable when the M1 is at least one element selected from the group consisting of Sr, Ba, Mg, La, Ce, Pr, Nd, Sm, Gd, Dy, Er, Yb, Sc and Y.

Also, the advantages in the present invention are particularly noticeable when the M2 is at least one element selected from the group consisting of Sr, Ce, Pr, Nd, Sm, Gd, Dy, Er, Yb, Sc and Y.

Figure 1:
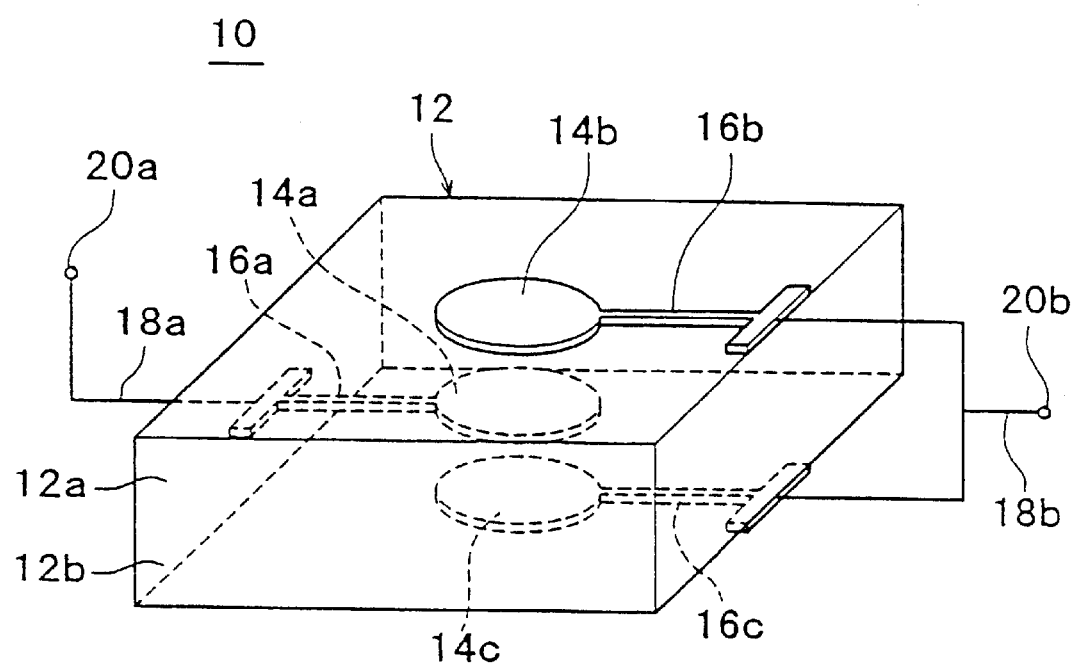
FIG. 1 is an isometric view of an exemplary piezoelectric ceramic vibrator in accordance with the present invention.
Figure 2:
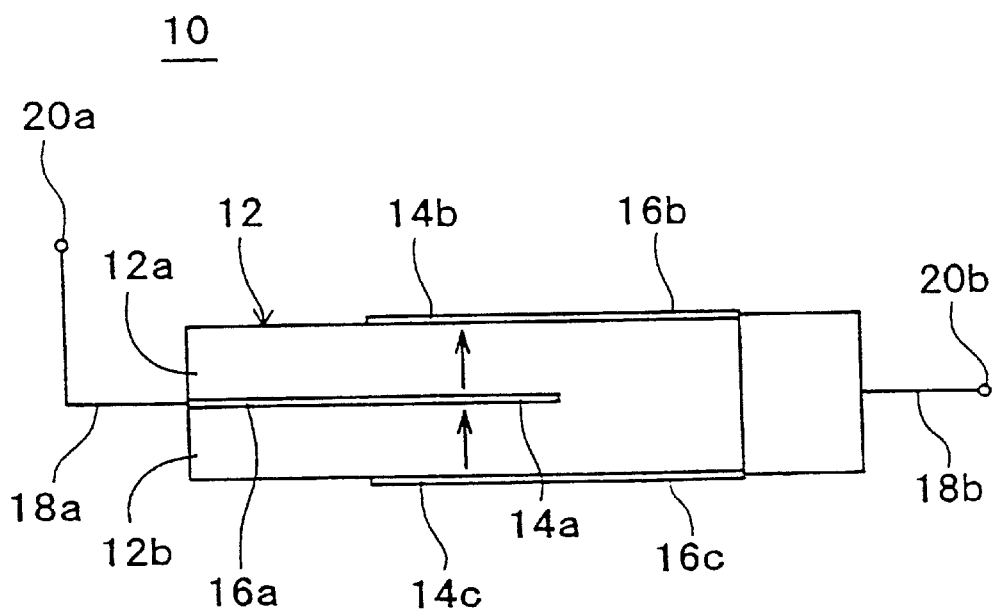
FIG. 2 is a schematic cross-sectional view of the piezoelectric ceramic vibrator shown in FIG. 1.

FIG. 1 is an isometric view of an exemplary piezoelectric ceramic vibrator in accordance with the present invention and FIG. 2 is a schematic cross-sectional view of the piezoelectric ceramic vibrator. A piezoelectric ceramic vibrator 10 includes, for example, a rectangular piezoelectric ceramic 12. The piezoelectric ceramic 12 has two piezoelectric ceramic layers 12a and 12b. These piezoelectric ceramic layers 12a and 12b are composed of the piezoelectric ceramic composition of the present invention and are laminated. Moreover, the piezoelectric ceramic layers 12a and 12b are polarized in the same thickness direction, as shown by the arrows in FIG. 2.

A circular vibrating electrode 14a is formed between the piezoelectric ceramic layers 12a and 12b, and an extraction electrode 16a having a T-shape extends from the vibrating electrode 14a to one end face of the piezoelectric ceramic 12. Another circular vibrating electrode 14b is formed on the piezoelectric ceramic layer 12a, and another extraction electrode 16b having a T-shape extends from the vibrating electrode 14b to the other end face of the piezoelectric ceramic 12. In addition, a third circular vibrating electrode 14c is formed on the piezoelectric ceramic layer 12b, and an extraction electrode 16c having a T-shape extends from the vibrating electrode 14c to the other end face of the piezoelectric ceramic 12.

The extraction electrode 16a is connected to an external terminal 20a via a lead line 18a, whereas the extraction electrodes 16b and 16c are connected to another external terminal 20b via another lead line 18b.

The present invention is not limited to the device configuration shown by the piezoelectric ceramic vibrator 10, and is applicable to other device configurations and other piezoelectric ceramic devices, such as piezoelectric ceramic vibrators using vibrational modes (for example, thickness shear vibration or thickness third harmonic waves), piezoelectric filters and piezoelectric ceramic oscillators.

EXAMPLES

As starting materials, $CaCO_3$, $Bi_2O_3$, $TiO_2$, $SrCO_3$, $BaCO_3$, $La_2O_3$, $Nd_2O_3$, $Sm_2O_3$, $Y_2O_3$ and $MnCO_3$ were prepared. These materials were weighed and mixed by a wet process in a ball mill for approximately 4 hours so as to have a composition $(Ca_{1-x}M1_x)Bi_4Ti_4O_{15}+y$ percent by weight of $MnCO_3$, wherein M1 is one of divalent metals other than Ca and trivalent metals other than Bi, $0<x\leq0.3$, and $0<y\leq1.6$, or to have a composition $(Ca_{1-x}M2_{2x/3})Bi_4Ti_4O_{15}+y$ percent by weight of $MnCO_3$, wherein M2 is a trivalent metal other than Bi, $0<x\leq0.5$, and $0<y\leq1.6$. The mixture was dried and calcined at 700 to 900° C. The calcined mixture was roughly pulverized and then finely pulverized together with a proper amount of organic binder by a wet process for 4 hours. The pulverized powder was screened using a 40-mesh sieve to adjust the particle size. The powder was pressed under a pressure of 1,000 kg/cm² to form a disk with a diameter of 12.5 mm and a thickness of 1 mm. The disk was sintered at 900 to 1,250° C. in air to form a disk ceramic. A silver paste was applied onto both main faces of the disk ceramic to form silver electrodes. A DC voltage of 3 to 10 kV/mm was applied between the silver electrodes for 10 to 30 minutes in an insulating oil at 100 to 150° C. for polarization. A piezoelectric ceramic sample was thereby prepared. Similarly, piezoelectric ceramic samples were prepared in which the types of the M1 or M2, the M1 or M2 contents (x), and the $MnCO_3$ contents (y) were different.

A quarter of the subscript x in the above formula $(Ca_{1-x}M1_x)Bi_4Ti_4O_{15}$ corresponds to the content of the divalent metal other than Ca with respect to 1 mole of Bi in the main component in the second aspect. Similarly, one-sixth of the subscript x in the above formula $(Ca_{1-x}M2_{2x/3})Bi_4Ti_4O_{15}$ corresponds to the content of the trivalent metal with respect to 1 mole of Bi in the main component in the third aspect.

The density, resistivity and electromechanical coupling coefficient kt of each sample were measured. Tables 1 and 2 show these results in addition to the type of the M1 or M2, x, and y. In Tables 1 and 2, the Sample Nos. with an asterisk indicates samples outside the ranges of the present invention.

TABLE 1

| Sample No. | M1 | x | y | Density (g/cm³) | Resistivity (Ω · cm) | kt (%) |
|---|---|---|---|---|---|---|
| 1* | — | 0 | 0 | 6.75 | $2.0 \times 10^{11}$ | 7.4 |
| 2 | — | 0 | 0.1 | 6.90 | $4.0 \times 10_{12}$ | 13.5 |
| 3 | — | 0 | 0.5 | 7.06 | $6.0 \times 10^{13}$ | 16.3 |
| 4 | — | 0 | 1.0 | 6.98 | $4.0 \times 10^{12}$ | 14.5 |
| 5 | — | 0 | 1.5 | 6.85 | $4.0 \times 10^{12}$ | 12.6 |
| 6* | — | 0 | 1.6 | 6.64 | $3.0 \times 10^{10}$ | Unpolarized |
| 7* | Sr | 0.1 | 0 | 6.81 | $2.0 \times 10^{11}$ | 8.2 |
| 8 | Sr | 0.1 | 0.5 | 7.04 | $5.0 \times 10^{13}$ | 18.7 |
| 9 | Sr | 0.1 | 1.5 | 6.97 | $4.0 \times 10^{12}$ | 14.7 |
| 10* | Sr | 0.1 | 1.6 | 6.65 | $2.0 \times 10^{10}$ | Unpolarized |
| 11* | Sr | 0.3 | 0 | 6.65 | $5.0 \times 10^{11}$ | 8.0 |
| 12 | Sr | 0.3 | 0.5 | 6.92 | $4.0 \times 10^{13}$ | 16.9 |
| 13 | Sr | 0.3 | 1.5 | 6.87 | $2.0 \times 10^{12}$ | 13.9 |
| 14* | Sr | 0.3 | 1.6 | 6.44 | $1.0 \times 10^{10}$ | Unpolarized |
| 15 | Sr | 0.35 | 0.5 | 6.27 | $9.0 \times 10^{11}$ | 10.6 |
| 16* | Ba | 0.1 | 0 | 6.75 | $2.0 \times 10^{11}$ | 7.8 |
| 17 | Ba | 0.1 | 0.5 | 6.97 | $3.0 \times 10^{13}$ | 17.9 |
| 18* | Ba | 0.1 | 1.6 | 6.63 | $1.0 \times 10^{10}$ | Unpolarized |
| 19* | Ba | 0.3 | 0 | 6.61 | $3.0 \times 10^{11}$ | 7.7 |
| 20 | Ba | 0.3 | 0.5 | 6.88 | $1.0 \times 10^{13}$ | 16.4 |
| 21* | Ba | 0.3 | 1.6 | 6.44 | $2.0 \times 10^{10}$ | Unpolarized |
| 22* | La | 0.1 | 0 | 6.59 | $2.0 \times 10^{11}$ | 6.9 |
| 23 | La | 0.1 | 0.5 | 6.90 | $8.0 \times 10^{12}$ | 15.9 |
| 24* | La | 0.1 | 1.6 | 6.42 | $1.0 \times 10^{10}$ | Unpolarized |
| 25* | Nd | 0.1 | 0 | 6.60 | $1.0 \times 10^{11}$ | 7.6 |
| 26 | Nd | 0.1 | 0.5 | 6.91 | $8.0 \times 10^{12}$ | 16.0 |
| 27* | Nd | 0.1 | 1.6 | 6.45 | $1.0 \times 10^{10}$ | Unpolarized |
| 28* | Sm | 0.1 | 0 | 6.46 | $2.0 \times 10^{11}$ | 7.7 |
| 29 | Sm | 0.1 | 0.5 | 6.89 | $9.0 \times 10^{12}$ | 15.9 |
| 30* | Sm | 0.1 | 1.6 | 6.33 | $1.0 \times 10^{10}$ | Unpolarized |
| 31* | Y | 0.1 | 0 | 6.70 | $2.0 \times 10^{11}$ | 7.2 |
| 32 | Y | 0.1 | 0.5 | 6.98 | $7.0 \times 10^{12}$ | 15.1 |
| 33* | Y | 0.1 | 1.6 | 6.50 | $1.0 \times 10^{10}$ | Unpolarized |

TABLE 2

| Sample No. | M1 | x | y | Density (g/cm³) | Resistivity (Ω · cm) | kt (%) |
|---|---|---|---|---|---|---|
| 34* | La | 0.15 | 0 | 6.49 | $2.0 \times 10^{11}$ | 6.5 |
| 35 | La | 0.15 | 0.5 | 6.89 | $7.0 \times 10^{12}$ | 15.2 |
| 36* | La | 0.15 | 1.6 | 6.47 | $1.0 \times 10^{10}$ | Unpolarized |
| 37* | La | 0.45 | 0 | 6.49 | $1.0 \times 10^{11}$ | 6.2 |

TABLE 2-continued

| Sample No. | M1 | x | y | Density (g/cm³) | Resistivity (Ω · cm) | kt (%) |
|---|---|---|---|---|---|---|
| 38 | La | 0.45 | 0.5 | 6.87 | $7.0 \times 10^{12}$ | 13.9 |
| 39* | La | 0.45 | 1.6 | 6.42 | $8.0 \times 10^{9}$ | Unpolarized |
| 40 | La | 0.5 | 0.5 | 6.01 | $8.0 \times 10^{10}$ | 10.0 |
| 41* | Nd | 0.15 | 0 | 6.47 | $1.0 \times 10^{11}$ | 6.5 |
| 42 | Nd | 0.15 | 0.5 | 6.85 | $7.0 \times 10^{12}$ | 14.2 |
| 43* | Nd | 0.15 | 1.6 | 6.52 | $1.0 \times 10^{10}$ | Unpolarized |

As shown in Tables 1 and 2, the samples in accordance with the present invention have electromechanical coupling coefficients kt which are higher than those of the manganese-free sample.

The piezoelectric ceramic composition in accordance with the present invention is not limited to the above EXAMPLES and may have other formulations within the scope of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric ceramic composition comprising a main component represented by the general formula $(Ca_{1-x}M1_x)Bi_4Ti_4O_{15}$ wherein M1 is at least one divalent metal other than Ca or trivalent metal other than Bi, and $0<x\leq0.45$; and manganese as an auxiliary component in an amount of more than 0 to not more than 1.5 percent by weight calculated as $MnCO_3$.

2. A piezoelectric ceramic composition according to claim 1 wherein the main component is represented by the general formula $CaBi_4Ti_4O_{15}$.

3. A piezoelectric ceramic composition according to claim 2, further comprising a divalent metal other than Ca in an amount of more than 0 to about 0.075 mole with respect to 1 mole of Bi in the main component.

4. A piezoelectric ceramic composition according to claim 3, wherein said divalent metal other than Ca is at least one element selected from the group consisting of Mg, Sr and Ba.

5. A piezoelectric ceramic composition according to claim 2, further comprising a trivalent metal other than Bi in an amount of more than 0 to about 0.075 mole with respect to 1 mole of Bi in the main component.

6. A piezoelectric ceramic composition according to claim 5, wherein said trivalent metal other than Bi is at least one element selected from the group consisting of La, Ce, Pr, Nd, Sm, Gd, Dy, Er, Yb, Sc and Y.

7. A piezoelectric ceramic composition according to claim 1 wherein the main component is represented by the general formula $(Ca_{1-x}M1_x)Bi_4Ti_4O_{15}$ wherein M1 is at least one of divalent metal other than Ca or trivalent metal other than Bi, and $0<x\leq0.3$.

8. A piezoelectric ceramic composition according to claim 7, wherein said M1 is at least one element selected from the group consisting of Sr, Ba, Mg, La, Ce, Pr, Nd, Sm, Gd, Dy, Er, Yb, Sc and Y.

9. A piezoelectric ceramic composition according to claim 7, wherein said M1 is selected from the group consisting of Sr, Ba, La, Nd, Sm and Y.

10. A piezoelectric ceramic composition according to claim 1 wherein the main component is represented by the general formula $(Ca_{1-x}M2_{2x/3})Bi_4Ti_4O_{15}$ wherein M2 is a trivalent metal other than Bi, and $0<x\leq0.45$.

11. A piezoelectric ceramic composition according to claim 10, wherein said M2 is at least one element selected from the group consisting of La, Ce, Pr, Nd, Sm, Gd, Dy, Er, Yb, Sc and Y.

12. A piezoelectric ceramic composition according to claim 10, wherein said M2 is La or Nd.

13. A piezoelectric ceramic device comprising:
   a piezoelectric ceramic comprising a piezoelectric ceramic composition according to claim 12 having a pair of electrodes thereon.

14. A piezoelectric ceramic device comprising:
   a piezoelectric ceramic comprising a piezoelectric ceramic composition according to claim 10 having a pair of electrodes thereon.

15. A piezoelectric ceramic device comprising:
   a piezoelectric ceramic comprising a piezoelectric ceramic composition according to claim 9 having a pair of electrodes thereon.

16. A piezoelectric ceramic device comprising:
   a piezoelectric ceramic comprising a piezoelectric ceramic composition according to claim 7 having a pair of electrodes thereon.

17. A piezoelectric ceramic device comprising:
   a piezoelectric ceramic comprising a piezoelectric ceramic composition according to claim 5 having a pair of electrodes thereon.

18. A piezoelectric ceramic device comprising:
   a piezoelectric ceramic comprising a piezoelectric ceramic composition according to claim 3 having a pair of electrodes thereon.

19. A piezoelectric ceramic device comprising:
   a piezoelectric ceramic comprising a piezoelectric ceramic composition according to claim 2 having a pair of electrodes thereon.

20. A piezoelectric ceramic device comprising:
   a piezoelectric ceramic comprising a piezoelectric ceramic composition according to claim 1 having a pair of electrodes thereon.

* * * * *